United States Patent
Jeon

(10) Patent No.: US 7,969,249 B2
(45) Date of Patent: Jun. 28, 2011

(54) PHASE LOCKED LOOP CIRCUIT

(75) Inventor: Ha Jun Jeon, Gyeonggi-do (KR)

(73) Assignee: Dongbu Hitek Co., Ltd., Seoul (KR)

( * ) Notice: Subject to any disclaimer, the term of this patent is extended or adjusted under 35 U.S.C. 154(b) by 52 days.

(21) Appl. No.: 12/638,213

(22) Filed: Dec. 15, 2009

(65) Prior Publication Data

US 2010/0164634 A1 Jul. 1, 2010

(30) Foreign Application Priority Data

Dec. 29, 2008 (KR) .......................... 10-2008-0135515

(51) Int. Cl.
*H03L 7/06* (2006.01)
*H03L 7/08* (2006.01)
(52) U.S. Cl. .................. 331/17; 331/25; 331/DIG. 2
(58) Field of Classification Search .................. 331/1 A, 331/4, 8, 14, 16–18, 25, DIG. 2; 327/156–159; 329/325; 332/127; 360/51; 375/376; 455/260
See application file for complete search history.

(56) References Cited

U.S. PATENT DOCUMENTS 5,410,572 A * 4/1995 Yoshida ........................ 375/376
* cited by examiner

*Primary Examiner* — David Mis
(74) *Attorney, Agent, or Firm* — Saliwanchik, Lloyd & Eisenschenk

(57) ABSTRACT

A phase locked loop circuit is provided comprising a voltage controlled oscillator (VCO), frequency divider, phase frequency detector (PFD), charge pump, waveform generator, loop filter, switching circuit, and lock detector. The VCO generates an oscillation signal. The frequency divider multiplies the frequency of the oscillation signal. The PFD compares the frequency-multiplied oscillation signal and an externally inputted reference signal to generate an error signal. The charge pump generates a signal according to the error signal. The loop filter controls the VCO to modulate the frequency of the oscillation signal and generate a spread spectrum clock based on the signal of the charge pump or waveform generator. The lock detector controls the switching circuit to selectively connect the charge pump to the loop filter during a non-lock state and the waveform generator to the loop filter during a lock state.

15 Claims, 2 Drawing Sheets

PHASE LOCKED LOOP CIRCUIT

CROSS-REFERENCE TO RELATED APPLICATION

This application claims the benefit under 35 U.S.C. §119 of Korean Patent Application No. 10-2008-0135515, filed Dec. 29, 2008, which is incorporated herein by reference in its entirety.

BACKGROUND

The present disclosure relates to phase locked loop circuits. FIG. 1 is a block diagram of a phase locked loop circuit 10.

Referring to FIG. 1, an oscillation signal outputted from a voltage controlled oscillator (VCO) 14 may become floating and create unstable states due to a change in external environments such as temperature.

Thus, a first frequency divider 16 and a second frequency divider 15 frequency-divide the oscillation signal of the VCO 14 respectively by 1/M and 1/R to convert the same into low-frequency signals.

A phase frequency detector (PFD) 11 receives a low-frequency reference frequency signal, which is stable in external environments, from an external Temperature Compensated X-tal Oscillator (TCXO), receives the frequency-divided signal, and compares the two signals to detect a floating state of the oscillation signal and then generate a control signal.

According to the control signal, a charge pump (CP) 12 supplies or absorbs electric charge to control a current value.

According to the charge quantity pulled up or down by the charge pump 12, a loop filter (LPF) 13 controls a voltage of the VCO 14 and reduces a spurious feature. Thus, the oscillation signal of the VCO 14 can maintain a stable state.

For example, the oscillation signal of the phase locked loop circuit 10 is used in display driver circuits, memory interfaces and baseband circuits of mobile communication terminals, which causes serious EMI (Electro-Magnetic Interference) problems due to the high speed of digital systems.

EMI filters or shields have been used to overcome the EMI problems. However, due to a limitation in price and technology, a spread spectrum clock generator 20 is currently being used to overcome the EMI problems.

That is, in order to reduce an EMI, the spread spectrum clock generator 20 includes a counter 22 and a sigma delta modulator (SDM) 21 modulates an oscillation signal, which has high energy at a specific frequency, into a frequency signal that has relatively low energy at a frequency within a predetermined bandwidth. By doing so, a clock frequency is not fixed at one frequency but varies between predetermined frequencies, so that energy at a specific frequency is distributed and it becomes a signal that does not cause an EMI to an adjacent electronic circuit.

Typically, a phase locked loop circuit has only to have one frequency divider. However, because the phase locked loop circuit 10 has the spread spectrum clock generator 20, it has the first frequency divider 16 and the second frequency divider 15 that have different frequency division factors. The first frequency divider 16 is allocated to the spread spectrum clock generator 20.

In order for the spread spectrum clock generator 20 to transfer a modulation frequency of about tens of kHz to about hundreds of kHz without distortion, the bandwidth of the oscillation signal must be set to about several kHz to about tens of kHz, which is about 1/10 of the modulation frequency.

Thus, the LPF 13 must have a capacitor with a large capacitance of several nF. However, because it is difficult to integrate in the phase locked loop circuit, the closed-loop spread spectrum clock generator 20 uses an external filter. This, however, increases the circuit size and the production costs due to the use of additional components.

BRIEF SUMMARY

Embodiments provide phase locked loop circuits that can remove a limitation in the bandwidth of an oscillation signal and overcome the problem of a large-capacitance capacitor of a loop filter by implementing an open-loop (not closed-loop) spread spectrum clock generator.

In one embodiment, a phase locked loop circuit comprises: a voltage controlled oscillator configured to generate an oscillation signal; a frequency divider configured to multiply the frequency of the oscillation signal; a phase frequency detector configured to compare the frequency-multiplied oscillation signal and an externally inputted reference signal to generate an error signal; a charge pump configured to generate a signal with a controlled current amount according to the error signal; a waveform generator configured to generate a signal with various amplitudes and periods; a loop filter charged/discharged according to the signal of the charge pump or the signal of the waveform generator, and controlling the voltage controlled oscillator to modulate the frequency of the oscillation signal and generate a spread spectrum clock; a switching circuit configured to selectively connect the output of the waveform generator and the charge pump to the loop filter; and a lock detector connected to the phase frequency detector to control the switching circuit before the lock state of the reference signal and the frequency-multiplied oscillation signal to connect the charge pump and the loop filter, and to control the switching circuit in the lock state to connect the waveform generator and the loop filter.

In another embodiment, a phase locked loop circuit comprises: a voltage controlled oscillator configured to generate an oscillation signal; a frequency divider configured to multiply the frequency of the oscillation signal; a phase frequency detector configured to compare the frequency-multiplied oscillation signal and an externally inputted reference signal to generate an error signal; a charge pump configured to generate a signal with a controlled current amount according to the error signal; at least one frequency divider configured to the frequency of the reference signal; an additional charge pump configured to generate a signal with a controlled current amount according to the output signal of the frequency divider; a loop filter charged/discharged according to the signal of the charge pump or the signal of the additional charge pump, and controlling the voltage controlled oscillator to modulate the frequency of the oscillation signal and generate a spread spectrum clock; a switching circuit configured to selectively connect the output of the additional charge pump and the charge pump to the loop filter; and a lock detector connected to the phase frequency detector to control the switching circuit before the lock state of the reference signal and the frequency-multiplied oscillation signal to connect the charge pump and the loop filter, and to control the switching circuit in the lock state to connect the additional charge pump and the loop filter.

The details of one or more embodiments are set forth in the accompanying drawings and the description below. Other features will be apparent from the description and drawings, and from the claims.

DETAILED DESCRIPTION

Phase locked loop circuits according to embodiments will be described in detail with reference to the accompanying drawings.

In the following descriptions of the embodiments, a detailed description of well-known functions or configurations will be omitted in order not to unnecessarily obscure the subject matter of the inventive concept.

Figure 1:
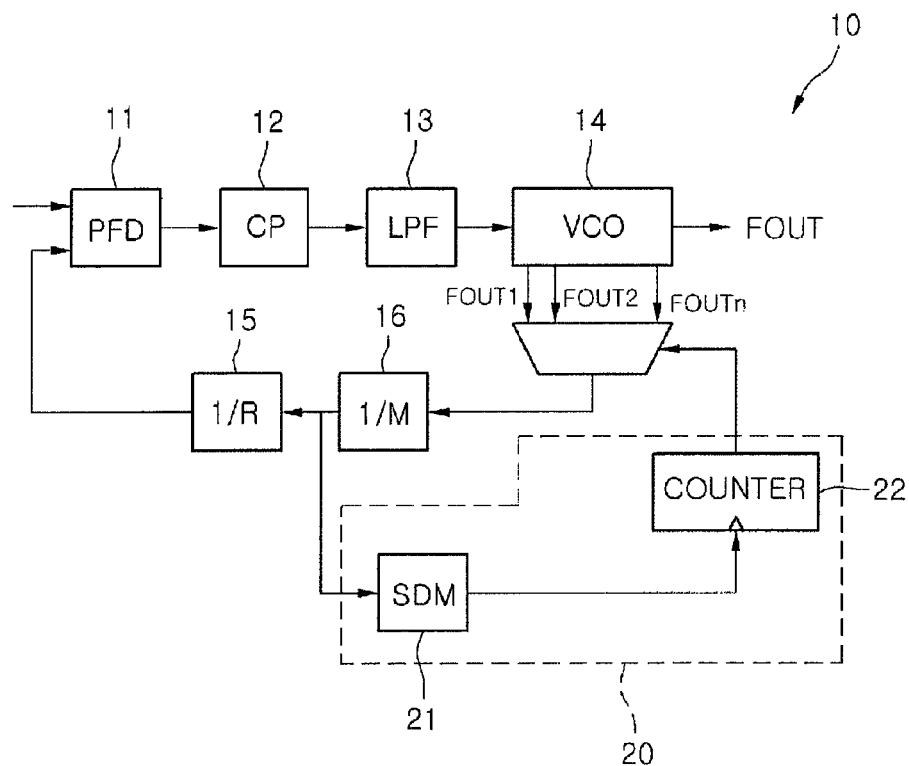
FIG. 1 is a block diagram of a phase locked loop circuit.
Figure 2:
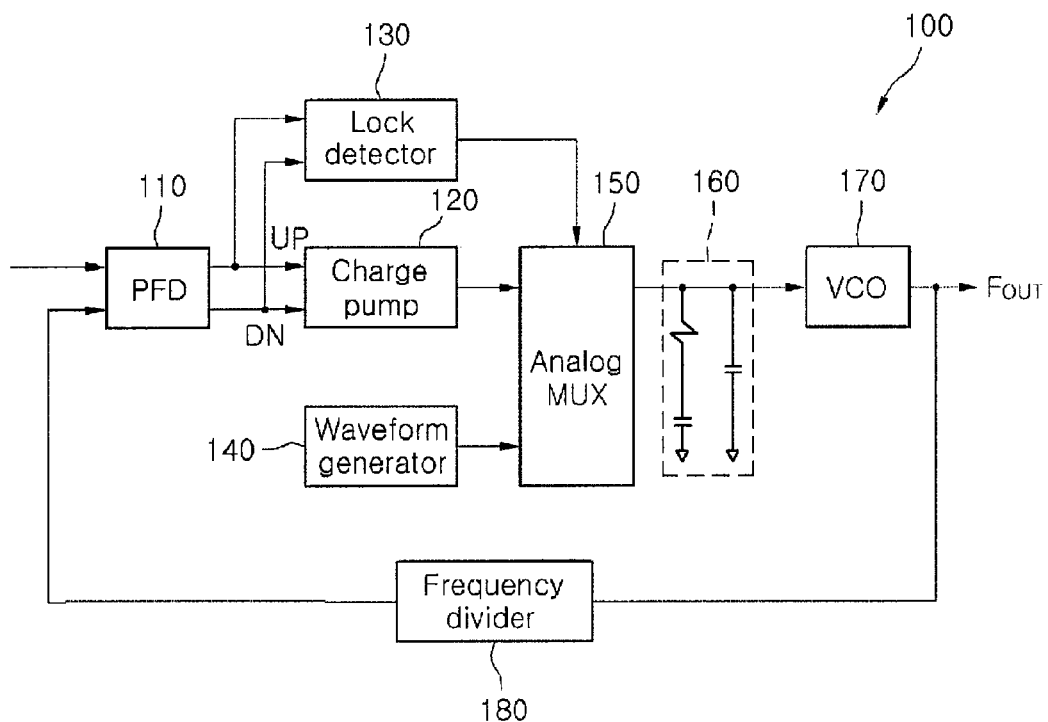
FIG. 2 is a block diagram of a phase locked loop circuit according to an embodiment.

FIG. 2 is a block diagram of a phase locked loop circuit 100 according to an embodiment.

Referring to FIG. 2, a phase locked loop circuit 100 according to an embodiment includes a phase frequency detector (PFD) 110, a charge pump 120, a lock detector 130, a waveform generator 140, a switching circuit (hereinafter referred to as 'MUX') 150, a loop filter 160, a voltage controlled oscillator (VCO) 170, and a frequency divider 180.

The PFD 110 receives a reference signal from an external circuit (e.g., a TCXO) (not illustrated).

The TCXO is a device that controls a frequency disturbance due to a temperature change in a crystal oscillator and provides a reference signal of a low frequency having a constant value independent of a temperature change.

For example, the TCXO oscillates a constant frequency signal that is not disturbed over 2.5 ppm even in a great temperature change (generally, −30° to +75°).

The reference signal has a lower frequency (e.g., MHz) than an oscillation signal (e.g., GHz) of the VCO 170.

Thus, the frequency divider 180 divides the frequency of the oscillation signal to decrease to the level of the reference signal so that the PFD 110 can compare the reference signal and the oscillation signal.

Unlike the related art, because a spread spectrum clock generator (the waveform generator 140), the MUX 150, and the lock detector 130 has an open-loop (not closed-loop) structure, the frequency divider 180 is configured as a separate circuit without needing to be divided into plural parts.

For example, if the TCXO provides a 100 MHz reference signal and the VCO 170 provides a 1.1 GHz reference frequency signal, the frequency divider 180 divides the oscillation signal by 1/10 times to convert the same into a signal of a comparable level.

The PFD 110 receives the reference signal and the oscillation signal, compares the two signals, generates corresponding error signals UP and DN, and transfers the same to the charge pump 120.

The charge pump 120 is an electronic circuit that supplies or absorbs (sources or sinks) a predetermined amount of charge to the MUX 150 according to the error signals.

That is, if the voltage of the oscillation signal is higher than the reference signal, the charge pump 120 supplies a predetermined amount of charge to the MUX 150 through a branch circuit; and if the voltage of the oscillation signal is lower than the reference signal, the charge pump 120 draws a predetermined amount of charge from the MUX 150.

The so-generated circuit charges/discharges the loop filter 160 through the MUX 150, and the VCO 170 outputs an oscillation signal of a frequency corresponding to the voltage of the charged/discharged loop filter 150.

As described above, the outputted oscillation signal is inputted through the frequency divider 180 to the PFD 110. The above operation is repeated until the two input signals of the PFD 110 have the same phase and frequency.

The lock detector 130 is connected to an output terminal of the PFD 110 to determine whether the reference signal and the oscillation signal have the same frequency and phase.

That is, if the two input signals of the PFD 110 have the same phase and frequency, an error signal is not outputted. Thus, the charge/discharge of the voltage of the loop filter 160 disappears, and the VCO 170 outputs a signal with a constant frequency. This is called a lock state, which is detected by the lock detector 130.

The lock detector 130 outputs a low-level signal before a lock state, and outputs a high-level signal after the lock state.

The MUX 150 may be an analog MUX, and connects the output of the charge pump 120 and the output of the waveform generator 140 to the loop filter 160 selectively according to the output signal of the lock detector 130.

Thus, before the reference signal and the oscillation signal become a lock state, the output of the charge pump 120 is connected to the loop filter 160 to form a PLL closed loop.

On the other hand, when the reference signal and the oscillation signal become a lock state, the MUX 150 disconnects the charge pump 120 from the loop filter 160 and connects the loop filter 160 to the output of the waveform generator 140.

Accordingly, the frequency of the oscillation signal of the VCO 170 is modulated according to the signal generated by the waveform generator 140.

The modulated oscillation signal is divided into a low frequency by the frequency divider 180, and it is inputted to the PFD 110.

The PFD 110 compares the oscillation signal and the reference signal, and the lock detector 130 detects only a lock state of the two signals. If the lock state is detected, it does not affect a PLL loop operation.

The frequency divider 180 controls the ratio of the frequency of the oscillation signal and the frequency of the PFD 110, thereby multiplying the output frequency by the frequency division ratio with respect to the input frequency.

If the input signal of the PFD 110 changes or the lock is released due to an external noise, the lock detector 130 outputs a low-level signal and the charge pump 120 and the loop filter 160 form a closed loop by the MUX 150, thereby creating a new lock state.

The waveform generator 140 may generate a signal for supporting various modulation schemes (e.g., Triangular, Sinusoidal, and Hershey Kiss), and may control the amplitude and period of the generated signal to change the frequency modulation and the modulation frequency to a desired level.

Thus, the loop filter 160 need not have a high-capacitance capacitor and may be an internal filter.

Figure 3:
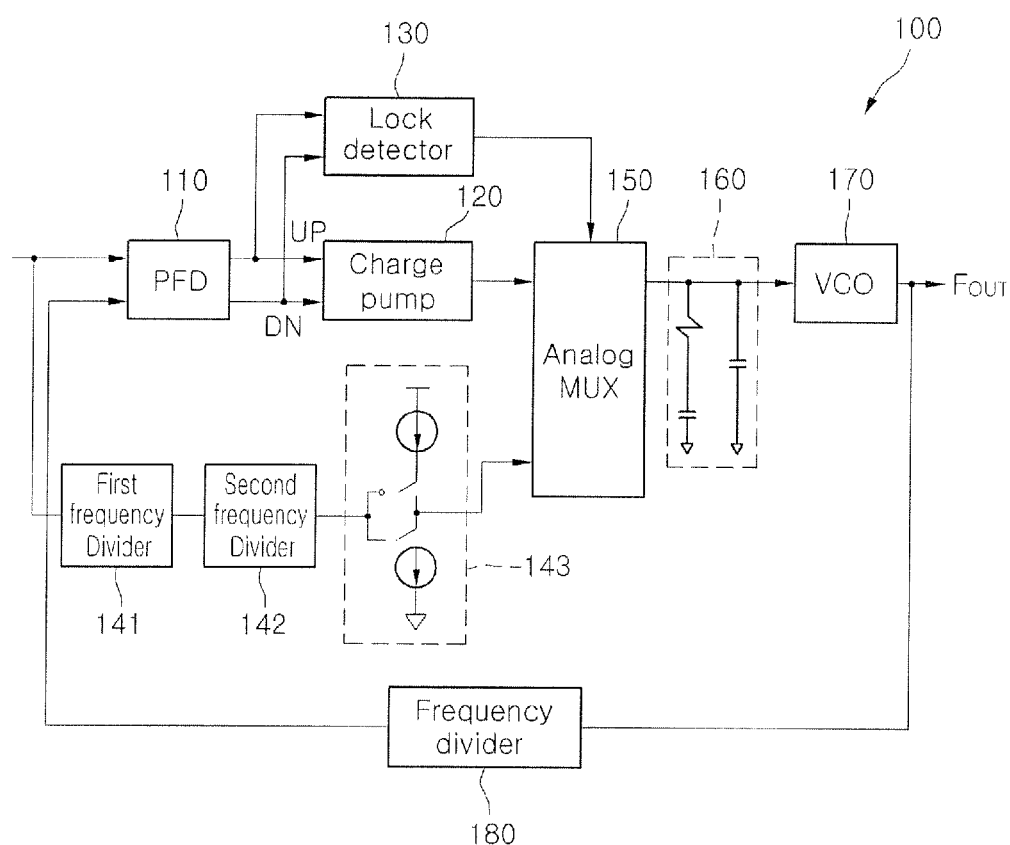
FIG. 3 is a block diagram of a phase locked loop circuit illustrating a circuit diagram of a waveform generator in the phase locked loop circuit according to an embodiment.

FIG. 3 provides a circuit diagram for one embodiment of the waveform generator 140 in the phase locked loop circuit 100 according to an embodiment.

A phase locked loop circuit 100 of FIG. 3 has the same configuration and operation as the phase locked loop circuit 100 of FIG. 2 with the exception that the waveform generator 140 is replaced with a first frequency divider 141, a second frequency divider 142, and an additional charge pump 143, and uses triangular modulation.

That is, FIG. 3 illustrates a specific embodiment of the waveform generator 140 in the phase locked loop circuit of FIG. 2.

An operation of the lock detector 130 according to the lock state, a PLL operation of a basic closed-loop structure, and a frequency modulation operation by charge/discharge of the loop filter 160 through the open loop of the waveform generator 140 are the same as described with reference to FIG. 2.

For example, referring to FIG. 3, a spread spectrum clock generation operation is performed by the modulation operation of the additional charge pump 143, the first frequency divider 141 and the second frequency divider 142.

The first frequency divider 141 and the second frequency divider 142 can be used to maintain the duty ratio of an input signal of the additional charge pump 143 to be 50:50, thus maintaining the charge/discharge amount of the loop filter 160.

The additional charge pump 143 has two current sources and a switch circuit to control the current amount, thus controlling the frequency modulation amount.

Also, an additional frequency divider (i.e., a third frequency divider) (not illustrated) can be further provided at the front end of the second frequency divider 142, thereby controlling the division ratio and the modulation frequency.

The embodiments have the following effects.

Firstly, the lock detector, the waveform generator, and the MUX are used to implement an open-loop spread spectrum clock generator, thereby making it possible to remove a limitation in the bandwidth of the oscillation signal. Accordingly, it is possible to overcome the problem of a large-capacitance capacitor of the loop filter.

Secondly, because a large-capacitance capacitor is not necessary, the loop filter can be implemented using an internal filter, thus making it possible to minimize the size of the spread-spectrum phase locked loop circuit and reduce the production costs.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A phase locked loop circuit comprising:
   a voltage controlled oscillator configured to generate an oscillation signal;
   a frequency divider configured to multiply the frequency of the oscillation signal;
   a phase frequency detector configured to compare the frequency-multiplied oscillation signal and an externally inputted reference signal to generate an error signal;
   a charge pump configured to generate a signal with a controlled current amount according to the error signal;
   a waveform generator configured to generate a signal with various amplitudes and periods;
   a loop filter charged/discharged according to the signal of the charge pump or the signal of the waveform generator, and controlling the voltage controlled oscillator to modulate the frequency of the oscillation signal and generate a spread spectrum clock;
   a switching circuit configured to selectively connect the output of the waveform generator and the charge pump to the loop filter; and
   a lock detector connected to the phase frequency detector to control the switching circuit such that the charge pump is connected to the loop filter during a non-lock state of the reference signal and the frequency-multiplied oscillation signal, and the waveform generator is connected to the loop filter during the lock state of the reference signal and the frequency-multiplied oscillation signal.

2. The phase locked loop circuit according to claim 1, wherein the switching circuit connects the charge pump and the loop filter during the non-lock state before and after the lock state to form a closed loop; wherein the phase frequency detector, the charge pump, the voltage controlled oscillator, and the frequency divider operate repeatedly until the reference signal and the frequency-multiplied oscillation signal become the lock state.

3. The phase locked loop circuit according to claim 1, wherein the lock detector outputs a low-level signal during the non-lock state to control the switching circuit, and outputs a high-level signal during the lock state to control the switching circuit.

4. The phase locked loop circuit according to claim 1, wherein the switching circuit is an analog multiplexer.

5. The phase locked loop circuit according to claim 1, wherein the switching circuit connects the waveform generator and the loop filter during the lock state to form an open loop; wherein the waveform generator, the loop filter, and the voltage controlled oscillator operate until release of the lock state, thereby modulating the frequency of the oscillation signal and generating a spread spectrum clock.

6. The phase locked loop circuit according to claim 1, wherein the waveform generator controls at least one of amplitude and period to generate an output signal to control the modulation amount of the oscillation signal according to the spread spectrum, wherein the generated output signal of the waveform generator is transferred to the loop filter.

7. A phase locked loop circuit comprising:
   a voltage controlled oscillator configured to generate an oscillation signal;
   a frequency divider configured to multiply the frequency of the oscillation signal;
   a phase frequency detector configured to compare the frequency-multiplied oscillation signal and an externally inputted reference signal to generate an error signal;
   a charge pump configured to generate a signal with a controlled current amount according to the error signal;
   at least one frequency divider configured to the frequency of the reference signal;
   an additional charge pump configured to generate a signal with a controlled current amount according to a final output signal of the at least one frequency divider;
   a loop filter charged/discharged according to the signal of the charge pump or the signal of the additional charge pump, and controlling the voltage controlled oscillator to modulate the frequency of the oscillation signal and generate a spread spectrum clock;

a switching circuit configured to selectively connect the output of the additional charge pump and the charge pump to the loop filter; and a lock detector connected to the phase frequency detector to control the switching circuit such that the charge pump is connected to the loop filter during a non-lock state of the reference signal and the frequency-multiplied oscillation signal, and the additional charge pump is connected to the loop filter during the lock state of the reference signal and the frequency-multiplied oscillation signal.

8. The phase locked loop circuit according to claim 7, wherein the switching circuit connects the charge pump and the loop filter during the non-lock state before and after the lock state to form a closed loop; wherein the phase frequency detector, the charge pump, the voltage controlled oscillator, and the frequency divider operate repeatedly until the reference signal and the frequency-multiplied oscillation signal become the lock state.

9. The phase locked loop circuit according to claim 7, wherein the lock detector outputs a low-level signal during the non-lock state to control the switching circuit, and outputs a high-level signal during the lock state to control the switching circuit.

10. The phase locked loop circuit according to claim 7, wherein the switching circuit is an analog multiplexer.

11. The phase locked loop circuit according to claim 7, wherein the switching circuit connects the additional charge pump and the loop filter during the lock state to form an open loop; wherein the at least one frequency divider, the additional charge pump, the loop filter, and the voltage controlled oscillator operate until release of the lock state, thereby modulating the frequency of the oscillation signal and generating a spread spectrum clock.

12. The phase locked loop circuit according to claim 7, wherein the additional charge pump controls at least one of amplitude and period to generate an output signal to control the modulation amount of the oscillation signal according to the spread spectrum, wherein the generated output signal of the additional charge pump is transferred to the loop filter.

13. The phase locked loop circuit according to claim 7, wherein the at least one frequency divider comprises a first frequency divider and a second frequency divider, wherein the charge/discharge ratio of the loop filter is determined by a duty ratio of the first frequency divider and the second frequency divider.

14. The phase locked loop circuit according to claim 13, wherein the at least one frequency divider further comprises a third frequency divider disposed between the second frequency divider and the additional charge pump to control the charge/discharge of the loop filter.

15. The phase locked loop circuit according to claim 7, wherein the additional charge pump includes two or more current sources and two or more switch circuits to generate the signal with the controlled current amount.

* * * * *